(12) United States Patent
Hammerschmidt et al.

(10) Patent No.: US 9,921,249 B2
(45) Date of Patent: Mar. 20, 2018

(54) SYSTEMS AND METHODS FOR HIGH VOLTAGE BRIDGE BIAS GENERATION AND LOW VOLTAGE READOUT CIRCUITRY

(71) Applicant: Infineon Technologies AG, Neubiberg (DE)

(72) Inventors: Dirk Hammerschmidt, Villach (AT); Peter Bogner, Wernberg (AT); David Astrom, Feistritz (AT)

(73) Assignee: Infineon Technologies AG, Neubiberg (DE)

( * ) Notice: Subject to any disclaimer, the term of this patent is extended or adjusted under 35 U.S.C. 154(b) by 691 days.

(21) Appl. No.: 14/265,456

(22) Filed: Apr. 30, 2014

(65) Prior Publication Data

US 2015/0316586 A1 Nov. 5, 2015

(51) Int. Cl.

| G01R 31/00 | (2006.01) |
|---|---|
| G01R 17/06 | (2006.01) |
| G01R 19/00 | (2006.01) |
| G01L 9/12 | (2006.01) |
| G01D 3/036 | (2006.01) |
| H02M 3/07 | (2006.01) |

(52) U.S. Cl.
CPC ............ *G01R 17/06* (2013.01); *G01D 3/036* (2013.01); *G01L 9/12* (2013.01); *G01R 19/0084* (2013.01); *H02M 3/07* (2013.01)

(58) Field of Classification Search
CPC .... G01R 17/06; G01R 19/0084; G01D 3/036; G01L 9/12; H02M 3/07
USPC ........................... 324/96, 76.11, 76.66, 76.79
See application file for complete search history.

(56) References Cited

U.S. PATENT DOCUMENTS

| 4,332,225 | A | * | 6/1982 | Cox | ...................... F02B 77/086 |
| | | | | | 123/697 |
| 4,343,182 | A | * | 8/1982 | Pompei | ..................... G01J 5/02 |
| | | | | | 374/117 |
| 4,359,030 | A | * | 11/1982 | Sone | .................. F02D 41/1494 |
| | | | | | 123/697 |
| 4,560,975 | A | * | 12/1985 | Jarva | ........................ G01D 3/02 |
| | | | | | 327/362 |
| 5,751,154 | A | * | 5/1998 | Tsugai | ................. G01D 5/2417 |
| | | | | | 324/661 |
| 6,137,277 | A | * | 10/2000 | Rajda | ........................ G05F 1/20 |
| | | | | | 323/258 |
| 6,169,428 | B1 | * | 1/2001 | Mader | ................ G01R 19/0084 |
| | | | | | 327/101 |
| 8,390,365 | B2 | | 3/2013 | Chang et al. | |
| 2004/0215260 | A1 | * | 10/2004 | Vonk | ...................... A61N 1/362 |
| | | | | | 607/11 |

(Continued)

FOREIGN PATENT DOCUMENTS

| CN | 101888181 A | 11/2010 |
| CN | 102457178 A | 5/2012 |

*Primary Examiner* — Giovanni Astacio-Oquendo
(74) *Attorney, Agent, or Firm* — Eschweiler & Potashnik, LLC

(57) ABSTRACT

A multi voltage sensor system includes one or more charge pumps, a sensor bridge and readout circuitry. The one or more charge pumps are configured to provide a high voltage. The sensor bridge is biased by the high voltage and is configured to provide sensor values. The readout circuitry includes only low voltage components. The readout circuitry is configured to receive the sensor values.

21 Claims, 12 Drawing Sheets

(56) References Cited

U.S. PATENT DOCUMENTS

| | | | |
|---|---|---|---|
| 2006/0176102 A1* | 8/2006 | Ayres | H02M 3/073 327/536 |
| 2008/0079444 A1* | 4/2008 | Denison | G01D 5/24 324/679 |
| 2008/0316154 A1* | 12/2008 | Kim | G09G 3/3655 345/87 |
| 2010/0164600 A1 | 7/2010 | Liu et al. | |
| 2011/0074969 A1* | 3/2011 | Takeda | H01L 27/14685 348/222.1 |
| 2013/0169271 A1* | 7/2013 | Nordman | G01R 33/098 324/222 |
| 2014/0048686 A1* | 2/2014 | Johansson | H02M 3/07 250/208.1 |
| 2015/0054572 A1* | 2/2015 | Muench | G01R 19/0023 327/536 |
| 2015/0077175 A1* | 3/2015 | Giuliano | H02M 3/07 327/536 |

* cited by examiner

800

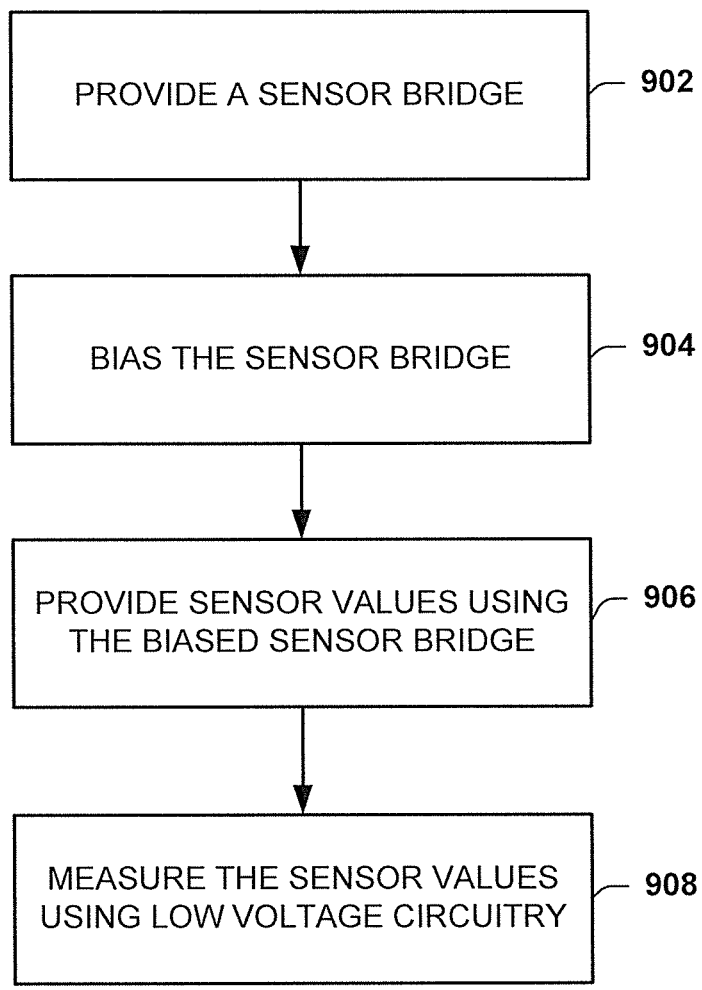

SYSTEMS AND METHODS FOR HIGH VOLTAGE BRIDGE BIAS GENERATION AND LOW VOLTAGE READOUT CIRCUITRY

BACKGROUND

A type of sensor frequently used in automotive systems is a pressure sensor. Such sensors include a deflectable component and generate an output based on the deflection. The output signal indicates the amount of deflection and is measured by a measuring component.

Typically, sensors operate at automotive board net voltage (7 . . . 18V) or are supplied with regulators from the ECU with a stabilized supply (e.g. 4.5 . . . 5.5V). To allow a relevant deflection of the membrane by electrostatic forces it is often required to operate at the sensors at higher voltage than the supply or its minimum value (e.g. 10 . . . 16V). However, operating at the high voltage consumes substantial power, increases component costs, and decreases operating speed for the circuitry of the measuring component.

BRIEF DESCRIPTION OF THE DRAWINGS

FIG. 9 is a flow diagram illustrating a method of operating a multi voltage sensor system.

DETAILED DESCRIPTION

Figure 1:
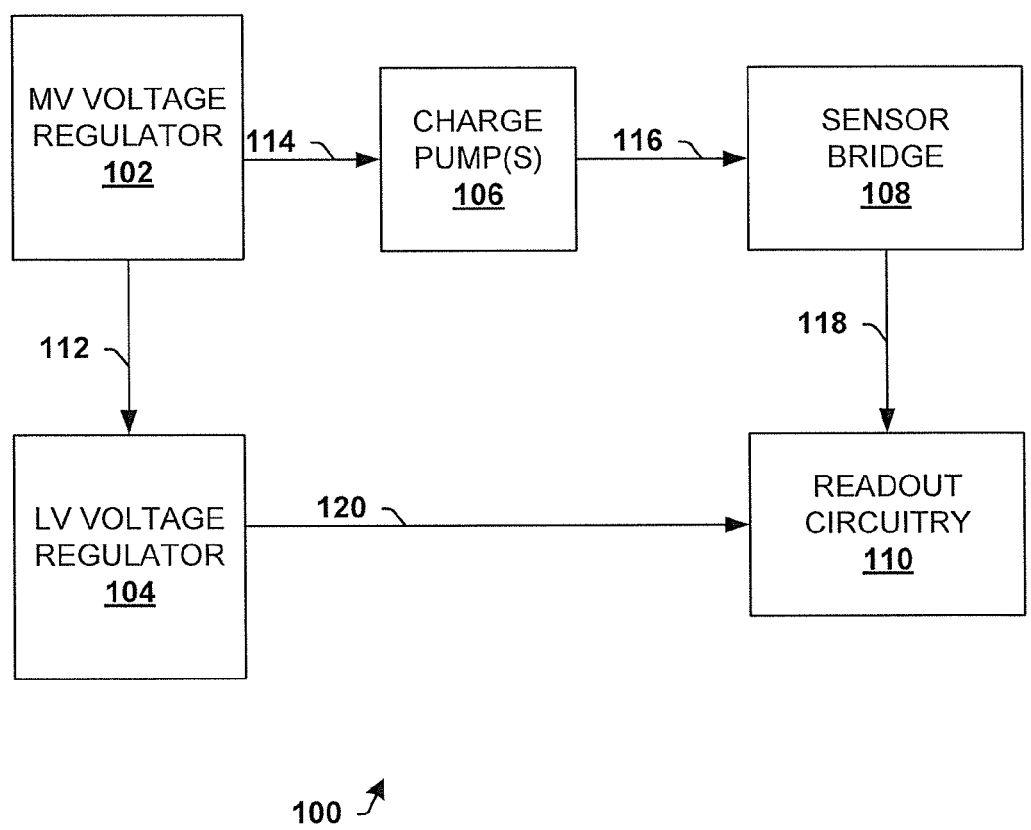
FIG. 1 is a block diagram illustrating a multi voltage sensor and readout system.

The present invention will now be described with reference to the attached drawing figures, wherein like reference numerals are used to refer to like elements throughout, and wherein the illustrated structures and devices are not necessarily drawn to scale.

Systems and methods are disclosed that enhance sensor based systems, such as automotive sensor systems including a pressure sensor. Such systems include a high voltage sensor, which is a sensor that requires a higher voltage than a regulated or supply voltage in order to properly operate. The systems and methods facilitate proper/reliable operation of high voltage sensors while mitigating power consumption and high voltage circuit components.

FIG. 1 is a block diagram illustrating a multi voltage sensor and readout system 100. The system 100 uses high voltages for high voltage sensors, but permits low voltages to be used for reading outputs of the sensors. The system 100 is shown and described in a simplified form in order to facilitate understanding.

The system 100 includes a mid or medium voltage (MV) regulator 102, a low voltage (LV) regulator 104, one or more charge pumps 106, a sensor 108 and readout circuitry 110. The MV regulator 102 receives a supply voltage, which is at a suitable level, such as 6-18 volts and is also connected to ground. The MV regulator 102 generates a medium voltage 114, which is regulated at a suitable level, such as 3 or 5 volts. The medium voltage 114 is below the supply voltage.

The LV regulator 104 receives power 112 from the MV regulator 102 and is also connected to ground. The power 112 is provided at a suitable level. In one example, the power 112 is the medium voltage 114. The LV regulator 104 generates a low voltage 120, which is regulated and at a suitable level, such as 1.5 volts.

The charge pumps 106 receive the medium voltage 114 and generate pump voltage(s) 116, which are at a greater magnitude than the medium voltage 114 and in some examples, larger than the supply voltage. Some examples of suitable pump voltages 116 include 12 volts, −12 volts, 0.75+12 volts, 0.75−12 volts, ½ *low voltage+12 volts, ½ *(low voltage−12 volts), and the like. The charge pumps 106 provide voltages higher than the supply voltage and are controllable in order to selectively bias the sensor bridge 108.

The sensor bridge 108 is a high voltage sensor. The sensor bridge 108 receives the pump voltages 116 and provides one or more sensor values 118, suitable for lower voltages, such as voltages below about 3 volts. The pump voltages 116 bias the sensor bridge using high voltages. In one example, the sensor bridge 108 includes a switching mechanism configured to alternate between the pump voltages 116 and/or ground. Some example switching mechanisms are provided below.

The sensor values 118 indicate properties, as described below. The sensor values 118 are in the form of capacitances, differential capacitance(s), voltages, currents and the like that correspond to the properties to be indicated.

Generally, the sensor bridge 108 measures physical properties based on changes to a mechanical structure, such as pressure, and generates the signals 118 based on the mechanical change. In one example, the sensor 108 generates the signals based on a deflection of a diaphragm.

In one example, the sensor 108 is a force feedback sensor and includes a deflectable membrane. A force feedback sensor is a type of sensor that includes a membrane, measures deflection of the membrane and stabilizes it to a desired operating position. The force that deflects the membrane generates a signal, such as a voltage dependent on the amount of deflection. Electrodes of the sensor are biased to compensate positively or negatively to the force that deflects the membrane. The bias can be selected to enhance the sensitivity of the sensor, improve the reliability, and the like. Additionally, the bias can be selected to compensate for environmental effects, such as temperature, pressure and the like. Similar biasing can be utilized for accelerometer based sensors.

The readout circuitry 110 is powered by the low voltage 120 and is configured to provide a measurement output based on the sensor values 118. In one example, the readout circuitry 110 uses a modified voltage or mid voltage derived from the low voltage. The mid voltage is a suitable voltage less than the low voltage. Typically, the mid voltage is about half the low voltage. Thus, if the low voltage 120 is about 1.5 volts, the mid voltage is about 0.75 volts.

The readout circuitry 110 measures the values 118 using low voltage circuitry, such as circuitry operable at voltages of less than 3 volts, the low voltage 120, the mid voltage, and the like. By using the low voltage 120 and not requiring a higher voltage, power consumption is mitigated, circuit component costs are reduced, and the low voltage circuitry operates at faster speeds.

Other high voltage based sensor systems require read circuitry that includes high voltage circuitry. As a result, such systems consume more power, have increased component costs, and slower operating speeds than the system 100.

Figure 2:
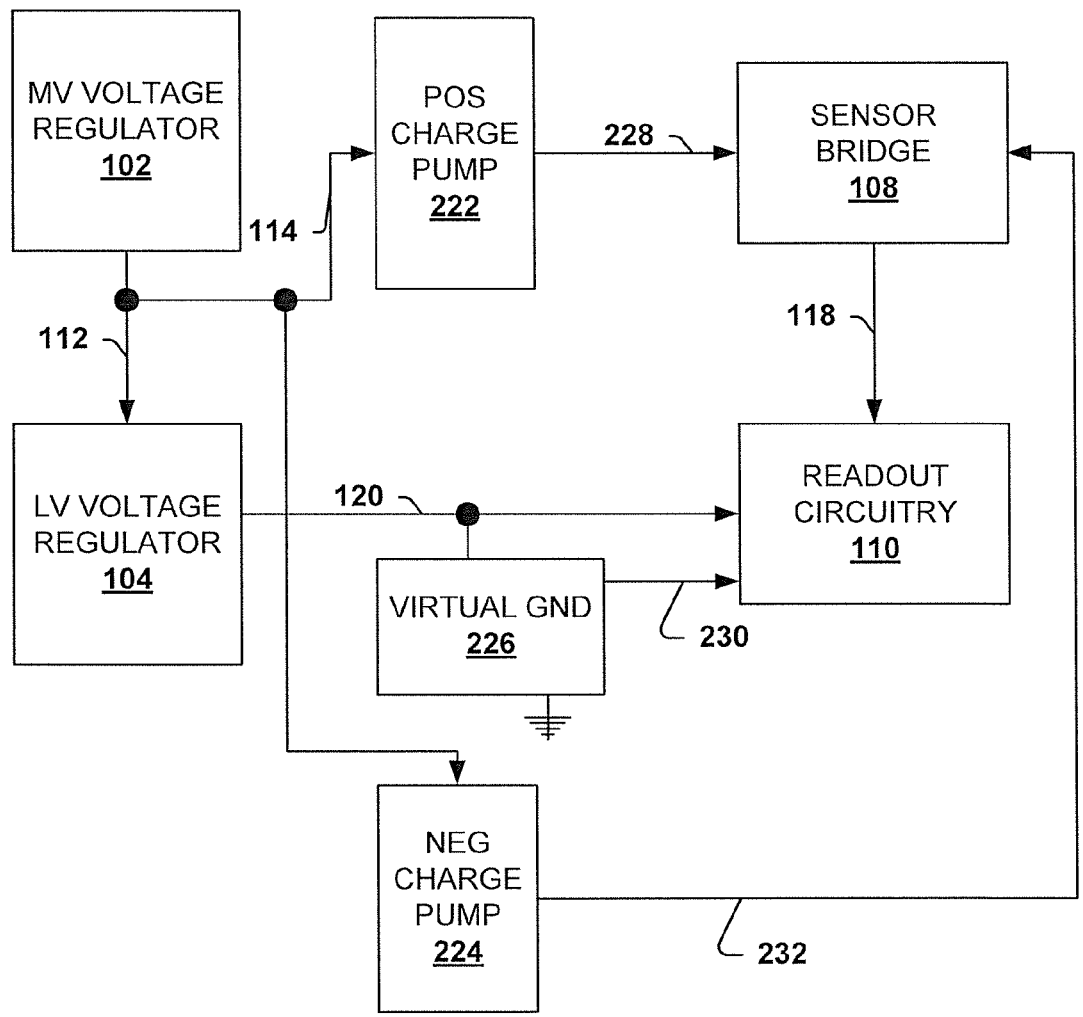
FIG. 2 is a block diagram illustrating a multi voltage sensor and readout system using negative and positive charge pumps.

FIG. 2 is a block diagram illustrating a multi voltage sensor and readout system 200 using negative and positive charge pumps. The system 200 can be utilized with or in addition to the system 100 described above. Items with identical reference numbers can be referenced above for additional description.

The system 200 includes a medium voltage (MV) regulator 102, a low voltage (LV) regulator 104, a positive charge pump 222, a negative charge pump 224, a sensor bridge 108, a virtual ground component 226 and readout circuitry 110. The MV regulator 102 receives a supply voltage, which is at a suitable level, such as 6-18 volts and is also connected to ground. The MV regulator 102 generates a medium voltage 114, which is regulated at a suitable level, such as 3 or 5 volts. The medium voltage 114 is below the supply voltage. The LV regulator 104 receives power 112 from the MV regulator 102 and is also connected to ground. The power 112 is provided at a suitable level. In one example, the power 112 is the medium voltage 114. The LV regulator 104 generates a low voltage 120, which is regulated and at a suitable level, such as 1.5 volts.

The positive charge pump 222 receives the medium voltage 114 from the voltage regulator 102 and generates a positive charge pump voltage 228. The charge pump voltage 228 is at a greater magnitude than the medium voltage 114. Some examples of suitable positive charge pump voltages include 12 volts, Vmid+12 volts, 0.75+12 volts, and the like. Vmid is typically half the low voltage 120.

The negative charge pump 224 also receives the medium voltage 114 from the regulator 102 and generates a negative charge pump voltage 232. The negative charge pump voltage 232 is at a greater magnitude than the medium voltage. Some examples of suitable voltages include −12 volts, Vmid−12 volts, 0.75−12 volts, and the like.

The sensor bridge 108 receives the pump voltages (228 and 232) and provides one or more sensor values 118, suitable for lower voltages, such as voltages below about 3 volts. The pump voltages 228 and 232 are centered about a mid point voltage, described below. As a result, the sensor bridge differential output is centered around this mid voltage as well, thus the only high voltage elements that are needed are high voltage transistors that receive the pump voltages. The circuitry on the other side of the bridge can utilize low voltage elements.

In one example, the sensor values 118 include capacitances, differential capacitance(s) and the like. The sensor bridge 108 measures physical properties based on changes to a mechanical structure and generates the signals 118 based on the force. In one example, the sensor 108 generates the signals based on deflection of a diaphragm or membrane. Some examples of suitable sensors are provided below.

The virtual ground component 226 receives the low voltage 120 and generates a mid point voltage (Vmid) 230 therefrom. Typically, the mid point voltage 230 is about half the low voltage 120. Thus, if the low voltage 120 is 1.5 V, the mid point voltage 230 is at about 0.75 V. However, it is appreciated that other values for the mid point voltage are possible.

The readout circuitry 110 is powered by the low voltage 120 and is configured to provide a measurement output based on the sensor values 118. The readout circuitry 110 also uses a modified voltage, the mid point voltage 230.

The readout circuitry 110 measures the values 118 using low voltage circuitry, such as circuitry operable at voltages of less than 3 volts, the low voltage 120, the mid voltage, and the like. The use of the low voltage circuitry permits the use of fast components, such as fast amplifiers and switches, with low resistances and low chip area consumption. Additionally, when compared with similar high voltage circuitry, the low voltage circuitry reduces parasitic capacitors of transistors to a lower value and reduces unwanted effects, like charge injection from switches.

Figure 3A:
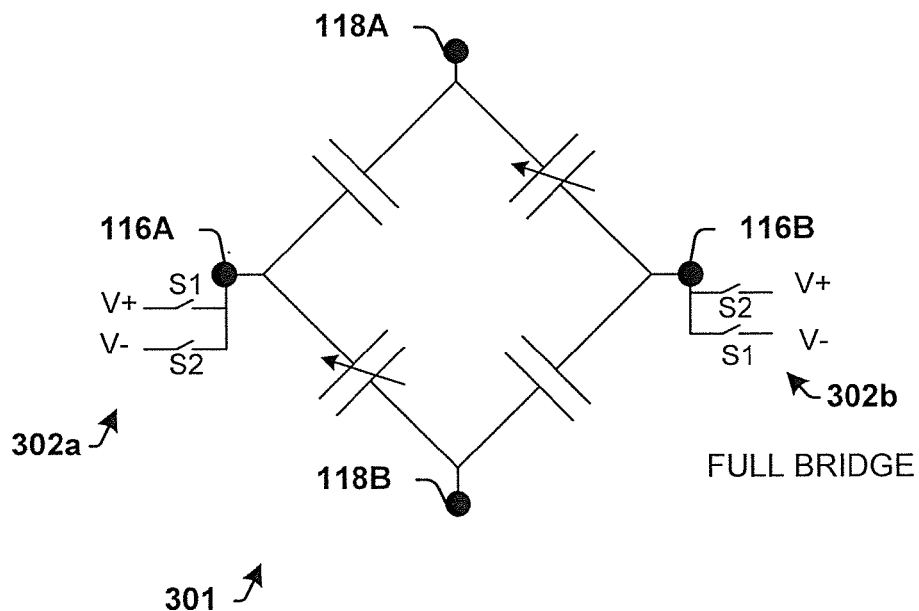
FIG. 3A is a diagram illustrating a sensor bridge having deflectable membranes.

FIG. 3A is a diagram illustrating a sensor bridge 301 having deflectable membranes. The sensor 301 can be utilized in systems such as those described above as the sensor bridge 108. The sensor 301 is generally used with a first operation phase and a second operation phase. For each phase, pump voltages and/or ground are applied. As a result, the sensor 301 generates the signals 118, in the form of a capacitance or capacitance difference. High voltage switches, shown as 302a and 302b, can be utilized to switch between the phases. The high voltage switches 302a and 302b alternate between applying the high voltages and are also referred to as polarity reverting switches.

The sensor bridge 301 is shown as a full bridge and includes terminals 118A and 118B, which provide sensor values 118 and terminals 116A and 116B, which receive charge pump signals 116. If this sensor half bridge is used in the embodiment or example 400 shown below, the terminal 116A receives a positive charge pump voltage during a first operation phase and the terminal 116B is switched to ground. During a second operation phase 116B is switched to the charge pump voltages while 116A is switched to gnd.

If this sensor bridge 301 is used in the system 200, described above, the terminal 116A receives a positive charge pump voltage during a first operation phase and the terminal 116B receives a negative charge pump voltage during a second operation phase. The terminals 116A and 116B are switched to the opposite charge pump voltages in the second phase than in the first phase.

The bridge 301 includes a first deflectable membrane between terminals 118B and 116A and a second deflectable membrane between terminals 118A and 116B. There is a first fixed capacitor between the 116A and 118A terminals and a second fixed capacitor between the 118B and 116B terminals. The first and second capacitors have reference values as their capacitances. The membranes have a capacitance that varies according to deflection of the membranes from pressure or some other source. The membranes and capacitors form a whetstone bridge and provide a differential capacitance at terminals 118A and 118B that varies according to deflection of the membranes. For example, at a pressure of zero, the differential capacitance is typically also at about zero. For increasing pressure, the differential capacitance increases.

The readout circuitry 110, in one example, measures the differential capacitance between 118A and 118B. An example of suitable readout circuitry is provided below with regard to FIGS. 8A and 8B, which includes high voltage switches configured to switch between charge pump voltages.

Figure 3B:
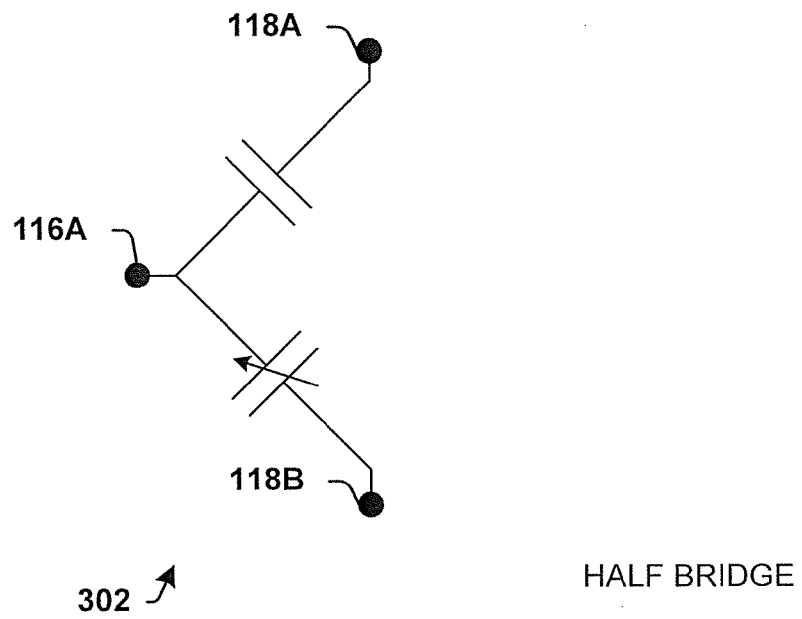
FIG. 3B is a diagram illustrating a sensor bridge having deflectable membranes in a left half bridge configuration.

FIG. 3B is a diagram illustrating a sensor bridge 302 having deflectable membranes in a left half bridge configuration. The sensor 302 can be utilized in systems such as those described above as the sensor bridge 108.

The sensor bridge 302 is as a half bridge and includes terminals 118A and 118B, which provide sensor values 118 and terminal 116A, which receives a single charge pump signal 116. When used with the system 400, described below, the terminal 116A receives a positive charge pump voltage in one clock phase while being switched to ground during another phase.

When used with the system 200, described above, terminal 116 is switched or alternated between the positive and the negative charge pump voltage.

Here, the bridge 302 includes a deflectable membrane between terminals 118B and 116A. There is a fixed capacitor between the 116A and 118A terminals. The capacitor has a reference values as its capacitance. The membrane has a capacitance that varies according to deflection of the membranes from pressure or some other source. The sensor values 118 are a difference of capacitances of the membrane and the fixed capacitor and can be measured by appropriate evaluation in a differential circuit. For example, at a pressure of zero, the capacitance difference between the capacitor with the deflectable membrane and the fixed capacitance is typically at about zero. For increasing pressure, the capacitance difference increases.

Readout circuitry, including a differential circuit, measures the capacitance difference from the terminals 118A and 118B.

Figure 3C:
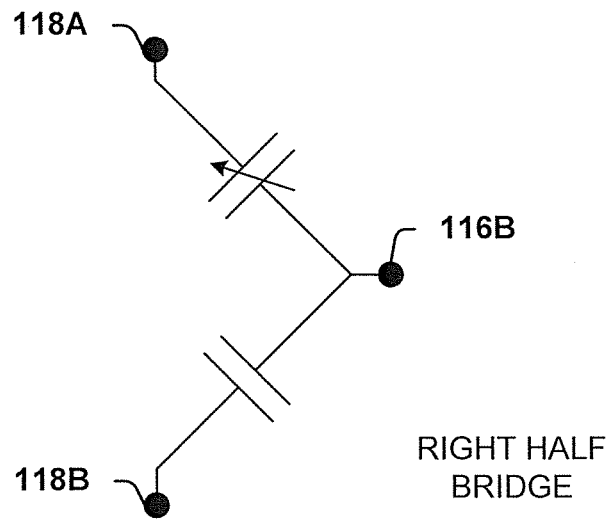
FIG. 3C is a diagram illustrating a sensor bridge having deflectable membranes in a right half bridge configuration.

FIG. 3C is a diagram illustrating a sensor bridge 303 having deflectable membranes in a right half bridge configuration. The sensor 303 can be utilized in systems such as those described above as the sensor bridge 108.

The sensor 303 operates substantially similar to the sensor 302 described above. However, the sensor 303 is symmetrical to the sensor 302 and includes terminal 116b instead of terminal 116A. In one example, the terminal 116A receives a negative charge pump voltage in one phase and is connected to ground in a next or second phase.

Figure 3D:
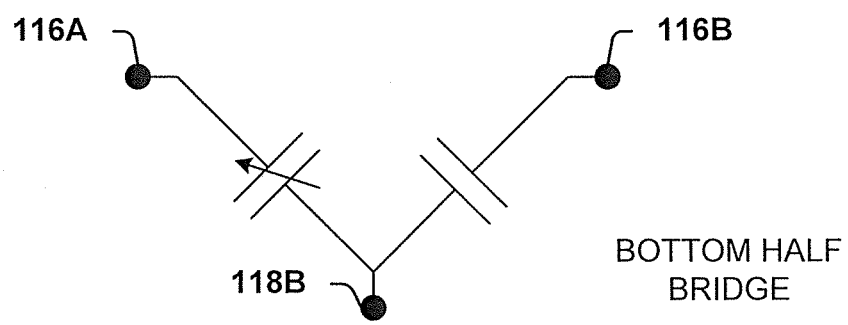
FIG. 3D is a diagram illustrating a sensor bridge having a deflectable membrane in a half bridge configuration.

FIG. 3D is a diagram illustrating a sensor bridge 304 having a deflectable membrane in another half bridge configuration, referred to as a bottom half bridge. The sensor 304 can be utilized in systems such as those described above as the sensor bridge 108.

The sensor bridge 304 is as a half bridge and includes terminals 116A and 116b, which receive positive and negative charge pump signals and terminal 118b, which provides a sensor value in the form of a capacitance. When used with the system 400, described above, the terminal 116A receives a positive charge pump voltage during a first operation phase and the terminal 116b is switched to ground in the first operation phase. During a second operation phase, terminal 116b is switched to the negative charge pump voltage while terminal 116A is switched or connected to ground.

When the sensor bridge 304 is used with the system 200, the terminal 116A receives a positive charge pump voltage during a first operation phase and the terminal 116b receives a negative charge pump voltage. During a second operation phase the terminals 116A and 116b are switched to the opposite charge pump voltages than in the first phase, thus the terminal 116A receives a negative charge pump voltage during a second operation phase and the terminal 116b receives the positive charge pump voltage during the second operation phase.

The bridge 304 includes a deflectable membrane between terminals 116A and 118b. There is a fixed capacitor between the 116b and 118b terminals. The capacitor has a reference values as its capacitance. The membrane has a capacitance that varies according to deflection of the membranes from pressure or some other source. The sensor values 118 is not a differential capacitance, but allows to measure the difference between the capacitance of the membrane and the fixed capacitor by evaluation of 2 measurements at terminal 118b during the 2 phases of the stimulus applied to 116a and 116b. For example, at a pressure of zero, the capacitance difference between the capacitor with the deflectable membrane and the one with the not deflectable membrane is typically also at about zero. For increasing pressure, the capacitance difference increases. For increasing pressure, the capacitance increases.

The readout circuitry 110, in one example, measures the capacitance at 118b. A level shifter can be utilized to shift the values 118 to a lower voltage.

Figure 4:
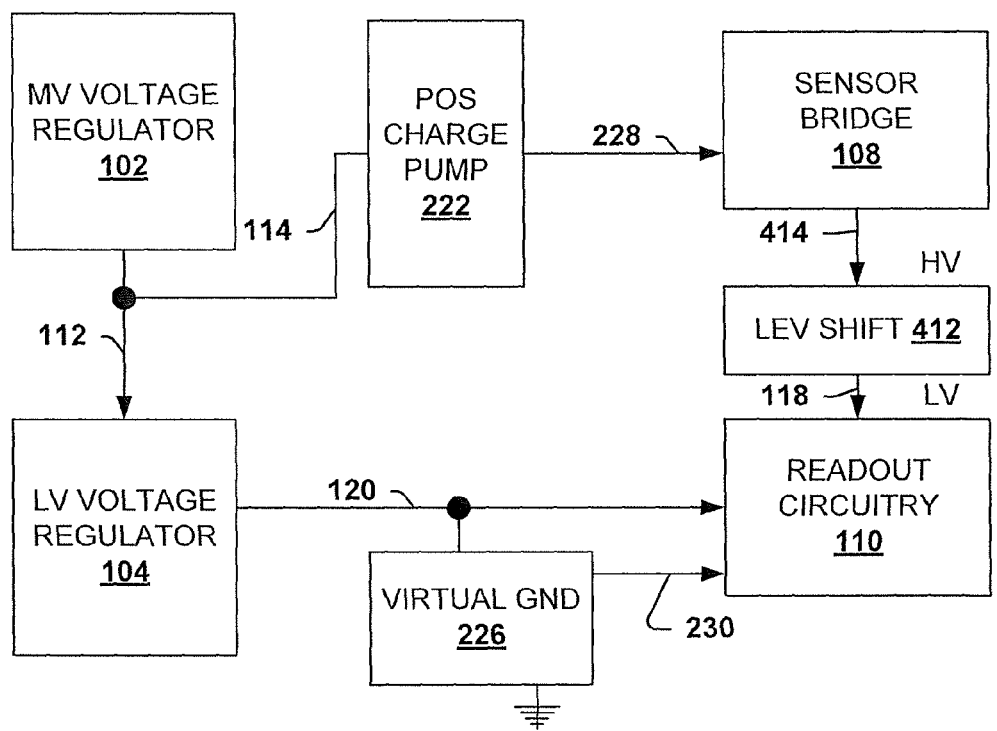
FIG. 4 is a block diagram illustrating a multi voltage sensor and readout system using only a positive charge pump.

FIG. 4 is a block diagram illustrating a multi voltage sensor and readout system 400 using only a positive charge pump. The system 400 can be utilized with or in addition to the system 100 described above. Items with identical reference numbers can be referenced above for additional description.

The system 400 includes a medium voltage (MV) regulator 102, a low voltage (LV) regulator 104, a positive charge pump 222, a sensor bridge 108, a virtual ground component 226, a level shifter 412 and readout circuitry 110. The MV regulator 102 receives a supply voltage, which is at a suitable level, such as 6-18 volts and generates a medium voltage 114, which is regulated at a suitable level, such as 3 or 5 volts. The medium voltage 114 is below the supply voltage. The LV regulator 104 receives power 112 from the MV regulator 102 and generates a low voltage 120, which is regulated and at a suitable level, such as 1.5 volts.

The positive charge pump 222 receives the medium voltage 114 from the voltage regulator 102 and generates a positive charge pump voltage 228. The charge pump voltage 228 is at a greater magnitude than the medium voltage 114. Some examples of suitable positive charge pump voltages include 12 volts, and the like. Vmid is typically half the low voltage 120.

The virtual ground component 226 generates the mid point voltage 230, as described above, from the low voltage 120.

The sensor bridge 108 receives only the positive charge pump voltage 228 and produces a high voltage sensor value 414. The sensor bridge 108 is also connected to ground. The level of the bridge output or value 414 is symmetrical to about half of the positive charge pump voltage 228, such as 6 V.

As one example, if the sensor bridge shown in FIG. 3A is used, the charge pump voltage 228 is connected to 116b and ground is connected to 116A and a high voltage differential sensor signal is provided at the terminals 118A and 118b as 414. If the charge pump voltage 228 is 12 Volts, the values 414 are symmetrical about 6 Volts.

The level shifter 412 lowers or shifts voltages of the high voltage values 414 to low voltage values 118. The low voltage values 118 are measurable by the readout circuitry 110. The level shifter 412 uses a suitable technique to shift the voltages. In one example, the technique includes using switches in an isolated floating well to shift the voltages.

The readout circuitry 110 operates substantially similar to the other readout circuitry described above.

Figure 5:
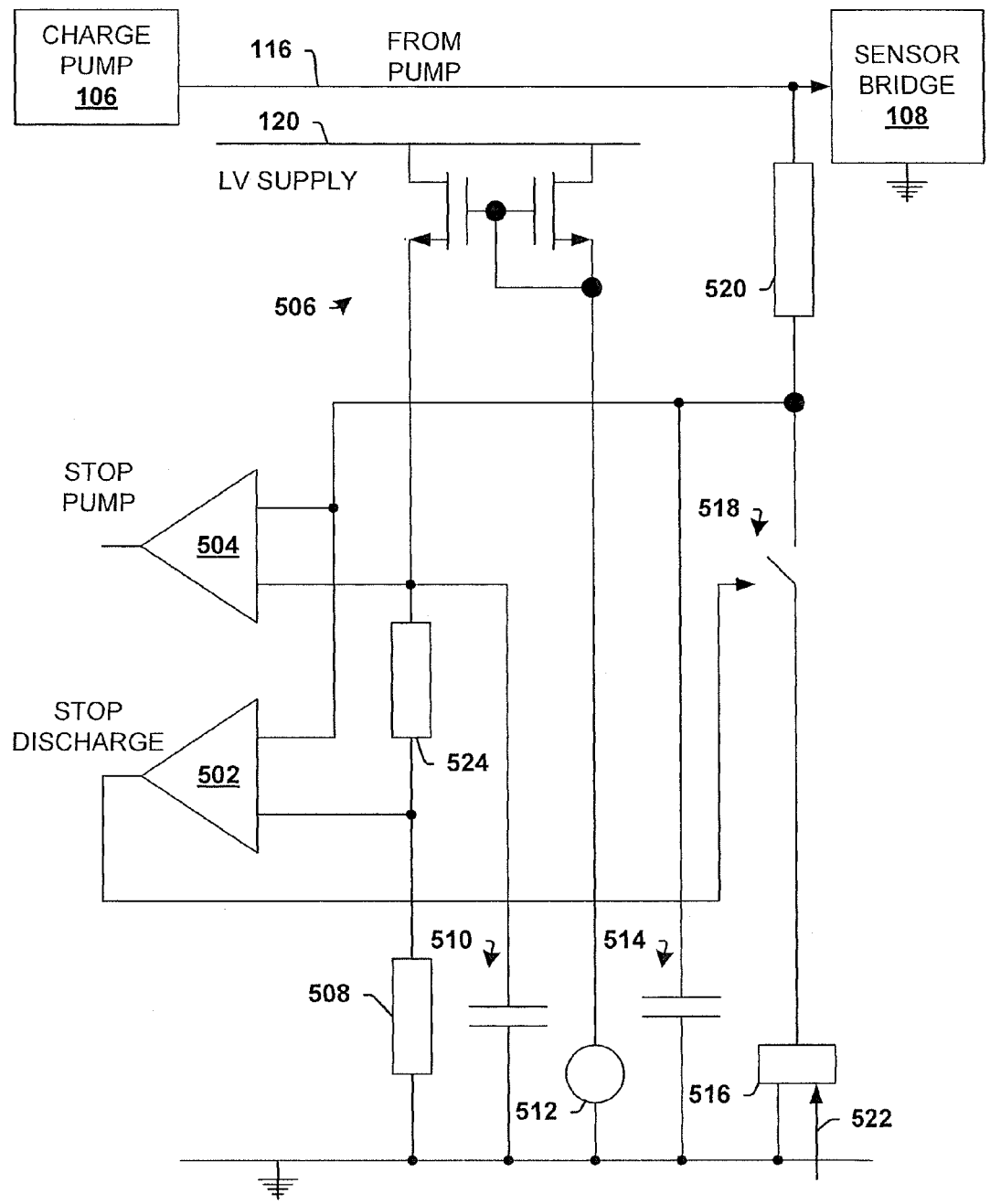
FIG. 5 is a diagram illustrating a charge pump control system.

FIG. 5 is a diagram illustrating a charge pump control system 500. The system 500 is utilized to control charge pumps, such as the charge pumps described above and used with the sensor bridges, also described above.

The charge pump voltage used in the systems, such as system 100 above, biases the sensor bridge. If the voltage supplied by the charge pump is inaccurate or varied, the measured values provided by the sensor bridge will vary. Thus, having accurate charge pump voltages is important. However, the values or measurements provided by the sensor bridge are taken at the end of a clock phase or cycle. Thus, accurate charge pump voltages are only needed at the end of a clock phase. For remaining portions, the charge pump voltages can vary.

The system 500 is an example of suitable circuitry that controls discharge and charging for a charge pump. The system 500 is coupled to a charge pump 106 and sensor bridge 108 to illustrate its use. It is noted that the system 500 does not require circuitry that operates at a high voltage.

The system 500 includes a stop pump comparator 504, a stop discharge comparator 502, a mirror circuit 506, a first resistor 524, a second resistor 508, a third resistor 520, a switch 518, a current control device 516, a first capacitor 510, a second capacitor 514, and a reference current 512. The system 500 uses multiple phases, including phase A, phase B and phase C. The phase A is at a starting point of a clock cycle and includes charging by the charge pump 106 to a charging threshold, phase B is after the phase A and includes a controlled discharge to a discharging threshold, and the phase C is after the phase B and at the end of the clock cycle and locks sensor capacitors at a value required for accurate measurement by the sensor 108.

The circuit 506 includes a pair of gate connected transistors that receive a low voltage supply 120 and provide current along the connected paths. The low voltage supply 120, as described above, is at a relatively low voltage, such as 3 Volts.

A first path from the circuit 506 is a voltage divider circuit and includes the first resistor 524 and the second resistor 508. A first terminal of the first resistor 524 is connected to a first input of the stop pump comparator 504. Its second terminal is connected to a first terminal of the second resistor and a first input of the stop discharge comparator 502. A second terminal of the second resistor 508 is connected to ground. Additionally, the first terminal of the first resistor 524 is coupled to ground via the first capacitor 510. A second path from the circuit 506 includes a reference current source 512 connected to ground.

The third resistor 520 receives a charge pump voltage 116 at a first terminal. The charge pump voltage 116 minus a voltage drop (Vdrop) caused by the third resistor 520 is provided to second inputs of the comparators 502 and 504 at a second terminal of the third resistor 520. The voltage drop is a function of a controlled current (Idac) times a resistance (Rdrop) of the third resistor 520. The Vdrop is a function of the controlled current (Idac), thus the Vtar can vary according to the Idac.

The provided voltage, Vtar, is also referred to as a feedback voltage. The Vtar is compared to threshold values at the stop comparator 504 and the stop discharge comparator 502. Threshold values are set as the other inputs to the comparators 502 and 504. The stop discharge threshold value is set to a value of Vmid, where Vmid is a mid point voltage of the LV 120, such as 0.75 Volts. The stop charge pump threshold value is set to a value slightly above Vmid, Vmid+delta V. The amount of the delta V is determined by the resistance of the first resistor 524 and current flowing through the first resistor. The amount of current flowing through the first resistor 524 is determined by the reference current source 512 via the current mirror 506. It is noted that the mid point voltage does not necessarily have to equal the mid point voltage described above, for example in the system 200.

An output of the stop pump comparator 504 is used to stop or deactivate a charge pump. An output of the stop discharge comparator 502 is coupled to and controls the switch 518. When the switch 518 is open, the Idac current stops flowing through the third resistor 520. When the switch 518 is closed, the Idac current flows through the third resistor 520.

The voltage provided at the first input of the stop discharge comparator 502 is the midpoint voltage, Vmid. The midpoint voltage is also referred to as a discharging threshold. The voltage provided at the first input of the stop pump comparator 504 is the midpoint voltage (Vmid) plus a delta amount. Thus, the stop pump comparator 504 compares the level shifted feedback voltage, Vtar, with a value slightly above the midpoint voltage Vmid, also referred to as the charging threshold. If the feedback exceeds this value, the charge pump is deactivated. Once deactivated, the charge pump discharges and the charge pump voltage 116 decreases, as does the Vtar.

The switch 518 controls discharging of the sensor capacitors of the sensor bridge 108. When closed, the current control circuit 516 can controllably discharge the sensor capacitors. When the switch 518 is open, it does not discharge the sensor capacitors. Furthermore, the switch 518 can be a low leakage switch to mitigate discharge when the switch 518 is open. The Idac is adjusted by the signal 522.

Figure 6:
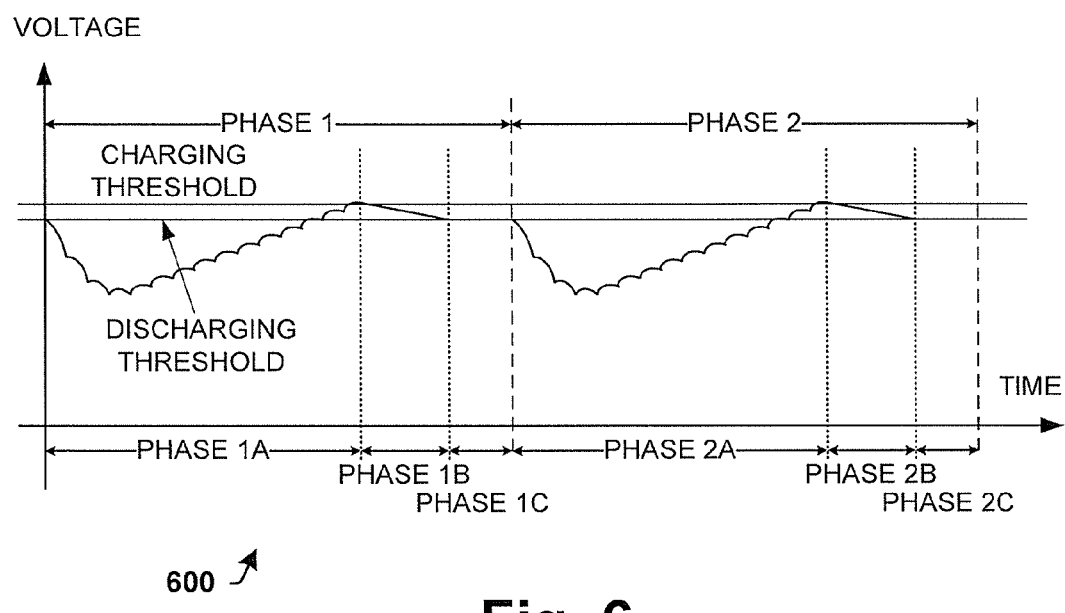
FIG. 6 is a graph illustrating an example operation of the system.

FIG. 6 is a graph 600 illustrating an example operation of the system 500. The graph 600 depicts operation of the system 500 during two clock phases. It is appreciated that the explanation is provided as an example to facilitate understanding and that values and durations shown are for illustrative purposes only.

Phase 1 is shown having 3 phases or subphases designated as 1A, 1B and 1C. The charge pump is ON to recharge the sensor capacitors. The charging is stopped when the charge pump voltage 116 exceeds a target value (Vtar) by the delta amount, which is the charging threshold. The comparator 504 senses the charge pump voltage 116 via the feedback and stops the charge pump.

In phase 1B, the sensor capacitors are at a voltage slightly above the voltage/bias needed to properly provide a measurement. The switch 518 is closed to controllably discharge the sensor capacitors during this phase. The range of discharge is selected or adjusted using the signal 522 with the current control circuit 516. The discharge current is a constant current. Once the target voltage is reached, which is also the discharging threshold, this phase ends and the switch 518 is opened to mitigate further discharge.

In phase 1C, the target value has been reached and is maintained on the sensor capacitor until the measurement values 118 are obtained and the end of the clock phase is reached. It is noted that the length of phase C can vary.

The phases A, B and C are repeated for the second clock cycle/phase as shown.

In one variation, the phase B is omitted and the charging threshold is set at the voltage required for accurate measurement of the sensor. It is appreciated that this avoids some complexity, but can result in less accuracy at the measurement voltage. For example, the stop discharge comparator 502 and related components can be omitted if phase B is not used.

Figure 7:
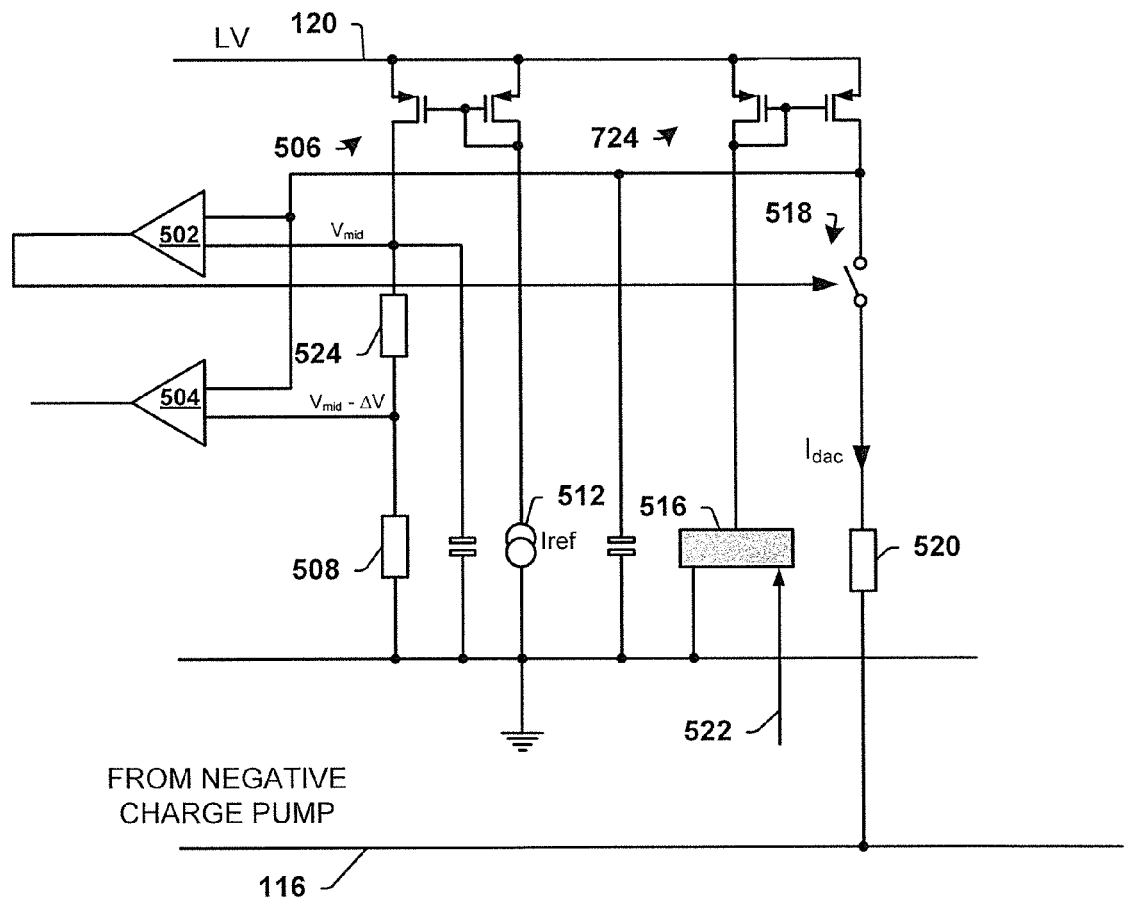
FIG. 7 is a diagram illustrating a charge pump control system for a negative charge pump.

FIG. 7 is a diagram illustrating a charge pump control system 700 for a negative charge pump. The system 700 controls applying an appropriate negative bias to a sensor bridge. The system 500 can be utilized to apply the positive bias and the system 700 can be used to apply the negative bias to the sensor bridge, such as the sensor bridges shown above.

The system 700 is substantially similar to the system 500 and description of the like components is omitted. However, the components are arranged differently and another current mirror 724 is added. The second current mirror 724 mirrors the Idac.

Figure 8A:
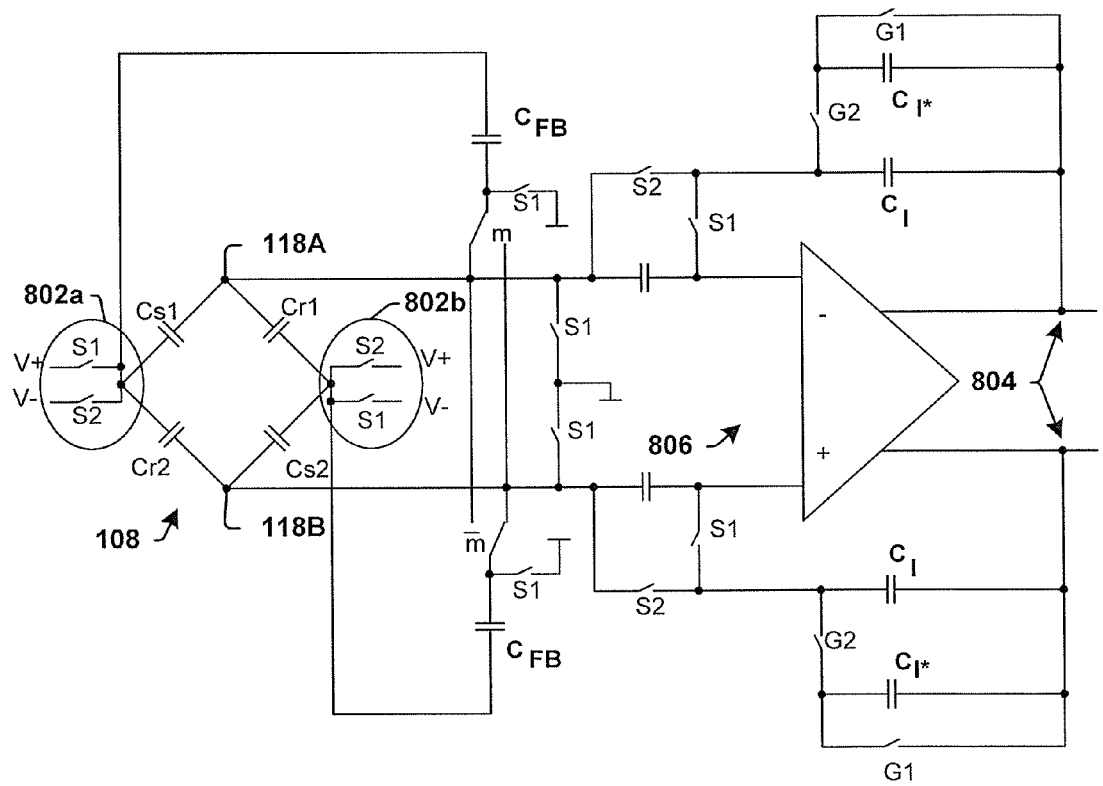
FIG. 8A is a diagram illustrating readout circuitry that can be utilized with multi voltage sensor and readout systems.

FIG. 8A is a diagram illustrating readout circuitry 800 that can be utilized with multi voltage sensor and readout systems, such as those described above. The readout circuitry 800 shown in FIG. 8A is provided as an example of suitable readout circuitry. The circuitry 800 includes a capacitor integrator with a capacitive bridge. The readout circuitry 800 can be used with the above systems as the readout circuitry 110. It is appreciated that variations of the circuitry 800 shown in FIG. 8A and other readout circuitry can be utilized.

The circuitry 800 is coupled to a sensor bridge 108, which receives positive (V+) and negative (V−) charge pump voltages via high voltage switches 802a and 802b. The circuitry 800 provides an output at terminals 804 and is coupled to the terminals 118a and 118b at its input.

The circuitry 800 includes an integrator stage 806 and includes offset compensation by way of the feedback capacitors $C_{FB}$. This arrangement connects the feedback in parallel to the sensor bridge and mitigates the effect of inaccuracies in the bridge bias and also mitigates settling requirements for the charging of the bridge capacitors, shown as Cs1, Cs2, Cr1 and Cr2. The output of the circuitry 800 is a digital representation or data of the measured property or the capacitance difference.

Switches S1 and S2 are operated by a clock with a non overlapping scheme. Thus, during operation, after S1 is switching OFF, S2 is switching ON and after S2 is switching OFF, S1 is switching ON. The phase during which S1 is ON is referred to as the sample phase. The phase during which S2 is ON is referred to as the integration/amplification phase. The switches S1 and S2 essentially flip the bridge 108 between the sample phase and the integration phase in order to double the amplitude provided by the bridge 108 at terminals 802a and 802b.

Switches G1 and G2 are static in that they do not operate in response to a clock signal. The switches G1 and G2 impact a time constant for the integrator stage 806. Thus, G1 and G2 are set to ON or OFF according to a selected time constant. Additionally, G1 and G2 are inverse of each other, thus G1 is ON (connected) when G2 is OFF (open) and G1 is OFF when G2 is ON.

The readout circuitry 800 described above is an example of suitable circuitry using low voltage components used to read a sensor bridge biased with high voltages.

Figure 8B:
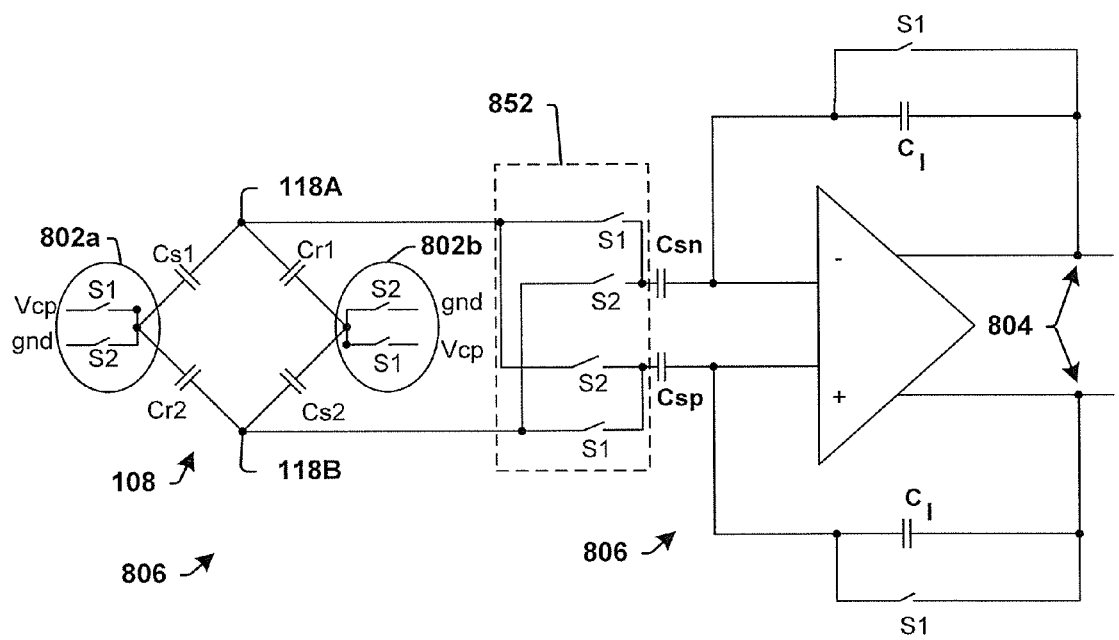
FIG. 8B is a diagram illustrating readout circuitry that can be utilized with multi voltage sensor and readout systems.

FIG. 8B is a diagram illustrating readout circuitry 850 that can be utilized with multi voltage sensor and readout systems, such as those described above. The readout circuitry 850 shown in FIG. 8B is provided as an example of suitable readout circuitry. The example circuitry 850 is includes a switched capacitor amplifier with a capacitive bridge. The readout circuitry 800 can be used with the above systems as the readout circuitry 110. It is appreciated that variations of the circuitry 850 shown in FIG. 8B and other readout circuitry can be utilized.

The circuitry 850 is coupled to a sensor bridge 108, which receives charge pump voltages via high voltage switches 802a and 802b. The circuitry 850 provides an output at terminals 804 and is coupled to the terminals 118a and 118b at its input. In this example, bias voltages alternating between a positive charge pump voltage (Vcp) and ground alternate being applied to the sensor bridge 108 via the switches 802a and 802b.

The circuitry 850 includes an integrator stage 806 and cross coupled switches 852. The cross coupled switches 852 mitigate voltages at its outputs, which is a high common mode voltage. This common mode voltage is reduced using sampling capacitors Csn and Csp. The output of the circuitry 850 is a digital representation or data of the measured property or the capacitance difference.

Similar to the circuitry 800, switches S1 and S2 are operated by a clock with a non overlapping scheme. Thus, after S1 is switching OFF, S2 is switching ON and after S2 is switching OFF, S1 is switching ON. The phase during which S1 is ON is referred to as the sample phase. The phase during which S2 is ON is referred to as the integration/amplification phase. The switches S1 and S2 essentially flip the bridge 108 between the sample phase and the integration phase in order to double the amplitude provided by the bridge 108 at terminals 802a and 802b.

There is no gain setting for the integrator stage 806, however gain selection can be included. In one example, the gain configuration using switches G1 and G2 is added into the circuitry 850.

The readout circuitry 850 described above is an example of suitable circuitry using low voltage components used to read a sensor bridge biased with high voltages.

FIG. 9 is a flow diagram illustrating a method 900 of operating a multi voltage sensor system. The method 900 includes reading sensor values with a low voltage readout circuitry by suitably biasing a sensor bridge.

A sensor bridge is provided at block 902. The sensor bridge is configured to provide sensor values in response to inertia, such as environmental conditions, pressure, movement, and the like. In one example, the sensor bridge includes deflectable membranes and reference capacitors and provides a differential capacitance as the sensor values in response to changes in pressure. Other examples of sensor bridges are provided above. Additionally, other components of the multivoltage sensor system are provided.

The sensor bridge is biased at block 904. The sensor bridge is biased using one or more high voltages as a voltage bias. The bias is typically adjusted about a midpoint voltage, which is generally about half of a low voltage used by the multivoltage sensor system. In one example, a positive charge pump is used to supply a positive charge voltage and a negative charge pump is used to supply a negative charge pump voltage, and the voltages are biased about a mid point voltage. Examples of suitable charge pumps are provided above. In one illustrative example, a mid point voltage of 0.75 volts, a low voltage of 1.5, suitable charge pump voltages include 12.75 volts for the positive charge pump voltage and −11.25 for the negative charge pump voltage.

Sensor values are provided at block 906 using the sensor bridge. The sensor values are provided at a low voltage level due to the operation of the sensor bridge.

The sensor values are measure or read at block 908 using low voltage readout circuitry. The readout circuitry operates using a low voltage or level, such as 1.5 volts. The readout circuitry uses the measurements to determine properties, such as pressure, motion, and the like.

Figure 10:
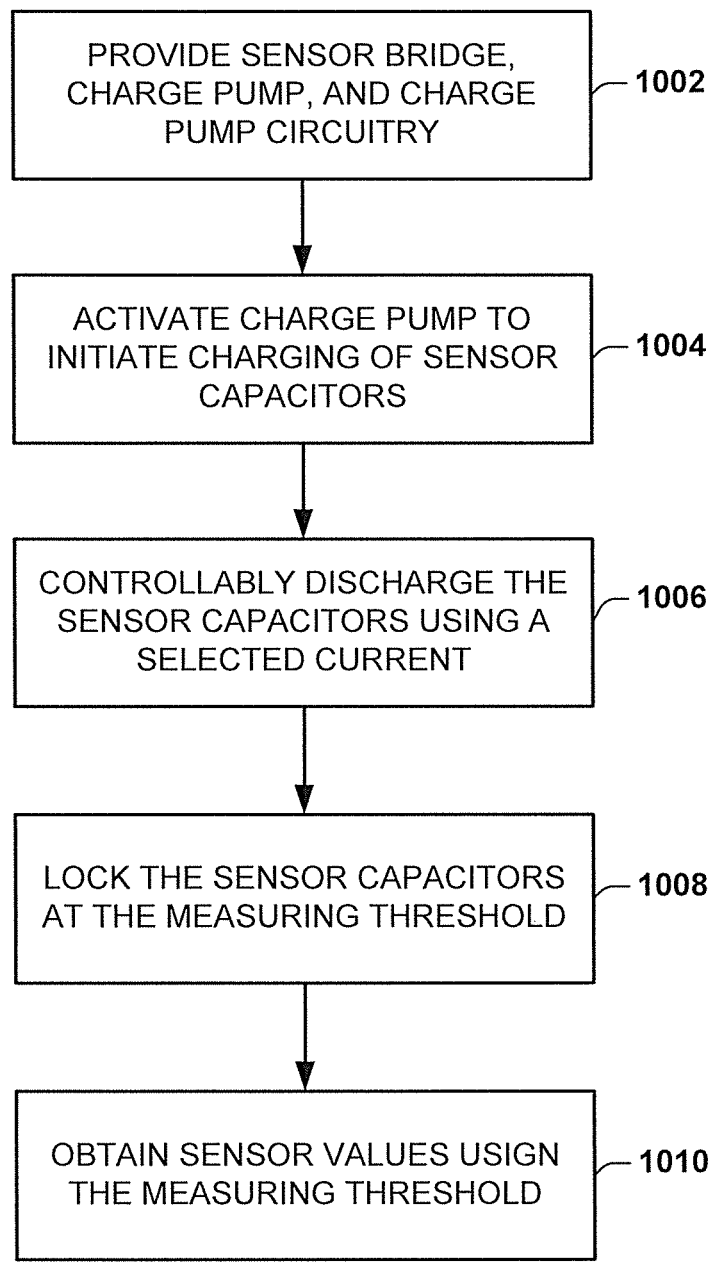
FIG. 10 is a flow diagram illustrating a method of operating a charge pump.

FIG. 10 is a flow diagram illustrating a method 1000 of operating a charge pump. The method 1000 utilizes non measuring portions of a clock phase to facilitate power consumption while providing suitably accurate high voltages during the measuring portion.

As described above, sensor values and measurements are obtained during a portion of each clock cycle or phase. Thus, the charge pump voltages do not need to be maintained at full power and accuracy during other portions. In this example, the measuring portion is at the end of a clock cycle/phase. However, it is appreciated that it can occur at other portions of a clock/phase. Additional details and descriptions for suitable circuitry usable with this method 1000 are provided above with regards to FIGS. 5 and 6.

At block 1002, a sensor bridge, a charge pump, and charge pump circuitry are provided. Examples of these components are provided and described above. Generally, the charge pump provides a bias voltage to the sensor bridge. The circuitry controls the providing of the bias voltage. The sensor bridge includes sensor capacitors that are biased via the bias voltage.

The charge pump is activated to charge the sensor capacitors during a first phase of a clock cycle at block 1004. Initially, there is a drop in voltage on the charge pump output and the sensor capacitors due to a previous measurement of sensor values. The charge pump is activated and charges/pumps the sensor capacitors to higher voltages.

Upon the sensor capacitors obtaining a charging threshold, the sensor capacitors are controllable drained/discharged at a selected current at block 1006. The selected current is constant and is selected to reduce the sensor capacitors to a suitable threshold in a period of time.

Upon the sensor capacitors lowering to a discharging threshold, the sensor capacitors are locked at a measuring threshold or voltage at block 1008. Generally, the measuring threshold is also the discharging threshold. However, in one variation, the charging threshold is also the measuring threshold and the discharging block 1008 can be omitted. The measuring threshold has a selected and/or suitable accuracy.

Sensor values are obtained at block 1010 using the measuring threshold at the sensor capacitors. Due to the sensor capacitors having a voltage at the measuring threshold, the sensor values are provided with a selected and/or suitable accuracy. The sensor values can then be measured or converted to indicate inertia or environmental properties, such as pressure, motion, and the like.

While the above methods are is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of system that may be used to implement methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A multi voltage sensor system includes one or more charge pumps, a sensor bridge and readout circuitry. The one or more charge pumps are configured to provide a high voltage. The sensor bridge is biased by the high voltage and is configured to provide sensor values. The readout circuitry includes only low voltage components. The readout circuitry is configured to receive the sensor values.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A multi voltage sensor system comprising:
   one or more charge pumps configured to receive a regulated voltage and provide a pump voltage based on the regulated voltage, where the pump voltage has a greater magnitude than the regulated voltage;
   a sensor bridge biased by the pump voltage and configured to provide sensor values;
   low voltage readout circuitry having only low voltage components, powered by a low voltage and configured to receive the sensor values and measure the sensor values, wherein the low voltage has a lower magnitude than the regulated voltage; and
   a voltage regulator configured to generate the low voltage from the regulated voltage.

2. The system of claim 1, further comprising a medium voltage regulator configured to generate the regulated voltage from a supply voltage, wherein the supply voltage has a greater magnitude than the regulated voltage.

3. The system of claim 1, wherein the one or more charge pumps include a positive charge pump and a negative charge pump.

4. The system of claim 3, wherein the sensor bridge includes polarity reverting switches, wherein the positive charge pump supplies a positive high voltage to the sensor bridge and the negative charge pump supplies a negative high voltage to the sensor bridge, and wherein the polarity reverting switches alternate between the positive high voltage and the negative high voltage.

5. The system of claim 1, wherein the sensor bridge is operated in a force feedback loop.

6. The system of claim 1, wherein the sensor bridge includes a deflectable membrane configured to provide a capacitance according to an amount of deflection.

7. The system of claim 1, wherein the sensor bridge includes a pair of deflectable membranes and a pair of reference capacitors, which are configured as a bridge.

8. The system of claim 1, wherein the pump voltage is adjusted by an amount to enhance operation of the sensor bridge.

9. The system of claim 1, further comprising a level shifter configured to lower a voltage level of the sensor values.

10. The system of claim 1, further comprising pump control circuitry configured to activate and deactivate the one or more charge pumps according to a charging phase, a controlled discharge phase, and a measurement phase for each clock cycle.

11. The system of claim 1, wherein the low voltage readout circuitry includes a switched capacitor level shifter having cross coupled switches, wherein the switched capacitor level shifter is configured to obtain digital representations of the sensor values.

12. A system for controlling a charge pump, the system comprising:
 a charging comparator configured to deactivate a charge pump upon a measurement sensor having a voltage exceeding a charging threshold;
 a discharging comparator configured to stop discharging the measurement sensor upon the measurement sensor having a voltage at a discharging threshold; and
 a current control device configured to control a discharge current for the measurement sensor.

13. The system of claim 12, further comprising a switch configured to disconnect the current control device from the measurement sensor according to a signal generated by the discharging comparator.

14. The system of claim 12, wherein the discharging threshold is set to a mid point voltage.

15. The system of claim 14, wherein the charging threshold is set to the mid point voltage plus a delta amount.

16. The system of claim 14, wherein the mid point voltage is assigned using a reference current and a resistor.

17. The system of claim 14, wherein the discharge current is led through a resistor and shifts a voltage of the charge pump.

18. The system of claim 12, wherein the system includes a charging phase, a discharging phase, and a measurement phase, wherein the charging phase ends on the measurement sensor having a voltage exceeding the charging threshold and the discharging phase ends on the measurement sensor having a voltage at the discharging threshold.

19. A method for reading a high voltage sensor with low voltage circuitry, the method comprising:
 generating a regulated voltage from a supply voltage;
 generating a charge pump voltage from the regulated voltage by a charge pump;
 biasing a sensor bridge by a charge pump voltage;
 providing sensor values from the bridge;
 shifting the provided sensor values to a lower voltage level;
 generating a low voltage from the regulated voltage, where the low voltage has a lower magnitude than the regulated voltage;
 biasing readout circuitry with the low voltage;
 measuring the sensor values using only the readout circuitry.

20. The method of claim 19, wherein the charge pump voltage is about a mid point voltage.

21. The method of claim 19, wherein the readout circuitry is biased at less than 2 volts.

* * * * *